US011444047B2

(12) United States Patent
Kawashima

(10) Patent No.: US 11,444,047 B2
(45) Date of Patent: Sep. 13, 2022

(54) SEMICONDUCTOR DEVICE

(71) Applicant: DENSO CORPORATION, Kariya (JP)

(72) Inventor: Takanori Kawashima, Anjo (JP)

(73) Assignee: DENSO CORPORATION, Kariya (JP)

( * ) Notice: Subject to any disclaimer, the term of this patent is extended or adjusted under 35 U.S.C. 154(b) by 159 days.

(21) Appl. No.: 16/810,978

(22) Filed: Mar. 6, 2020

(65) Prior Publication Data

US 2020/0312802 A1 Oct. 1, 2020

(30) Foreign Application Priority Data

Mar. 29, 2019 (JP) .............................. JP2019-066970

(51) Int. Cl.
*H01L 23/31* (2006.01)
*H01L 23/00* (2006.01)

(52) U.S. Cl.
CPC .......... *H01L 24/13* (2013.01); *H01L 23/3107* (2013.01); *H01L 24/16* (2013.01); *H01L 2224/13019* (2013.01); *H01L 2224/16245* (2013.01)

(58) Field of Classification Search
CPC ......... H01L 24/13; H01L 24/16; H01L 24/32; H01L 24/83; H01L 24/40; H01L 23/3107; H01L 2224/13019; H01L 2224/16245; H01L 2224/0603; H01L 2224/83815
See application file for complete search history.

(56) References Cited

U.S. PATENT DOCUMENTS

| 2004/0061220 A1* | 4/2004 | Miyazaki .......... H01L 23/49827 257/723 |
| 2013/0065361 A1 | 3/2013 | Shen |
| 2015/0262920 A1* | 9/2015 | How .................... H01L 21/4825 257/676 |
| 2020/0043887 A1 | 2/2020 | Ogawa et al. |

FOREIGN PATENT DOCUMENTS

| JP | 6-275627 A | 9/1994 |
| JP | 09-197411 A | 7/1997 |
| JP | 11-040728 A | 2/1999 |
| JP | 2006-19504 A | 1/2006 |
| JP | 2008-34602 A | 2/2008 |
| JP | 2017-130576 A | 7/2017 |
| WO | 2018/181727 A1 | 10/2018 |

\* cited by examiner

*Primary Examiner* — Thanh Y. Tran
(74) *Attorney, Agent, or Firm* — Sughrue Mion, PLLC

(57) ABSTRACT

A semiconductor device disclosed herein may include: a semiconductor element including an electrode on a surface of the semiconductor element; and a terminal bonded to the electrode via a bonding material, wherein the electrode may include a protrusion portion that protrudes toward the terminal and is in contact with the bonding material.

15 Claims, 5 Drawing Sheets

SEMICONDUCTOR DEVICE

CROSS-REFERENCE TO RELATED APPLICATION

This application claims priority to Japanese Patent Application No. 2019-066970, filed on Mar. 29, 2019, contents of which are incorporated herein by reference.

TECHNICAL FIELD

The technology disclosed herein relates to a semiconductor device.

BACKGROUND

Japanese Patent Application Publication No. H11-040728 describes a semiconductor device. The semiconductor device includes a semiconductor element including an electrode on a surface of the semiconductor element, and a terminal bonded to the electrode via a bonding material. The terminal includes a convex portion. The terminal is bonded to the electrode at the convex portion.

SUMMARY

In the above-described semiconductor device, the convex portion of the terminal is bonded to the electrode of the semiconductor element via the bonding material such as solder. However, the electrode of the semiconductor element has a relatively small size. Therefore, unintentional displacement of the terminal during the bonding of the convex portion of the terminal to the electrode would lead to contact of the terminal and/or the bonding material with an unintended part of the semiconductor element, for example. The disclosure herein provides a technology capable of solving or at least mitigating such a problem.

A semiconductor device disclosed herein may comprise: a semiconductor element comprising an electrode on a surface of the semiconductor element; and a terminal bonded to the electrode via a bonding material, wherein the electrode may comprise a protrusion portion that protrudes toward the terminal and is in contact with the bonding material.

DETAILED DESCRIPTION

Figure 1:
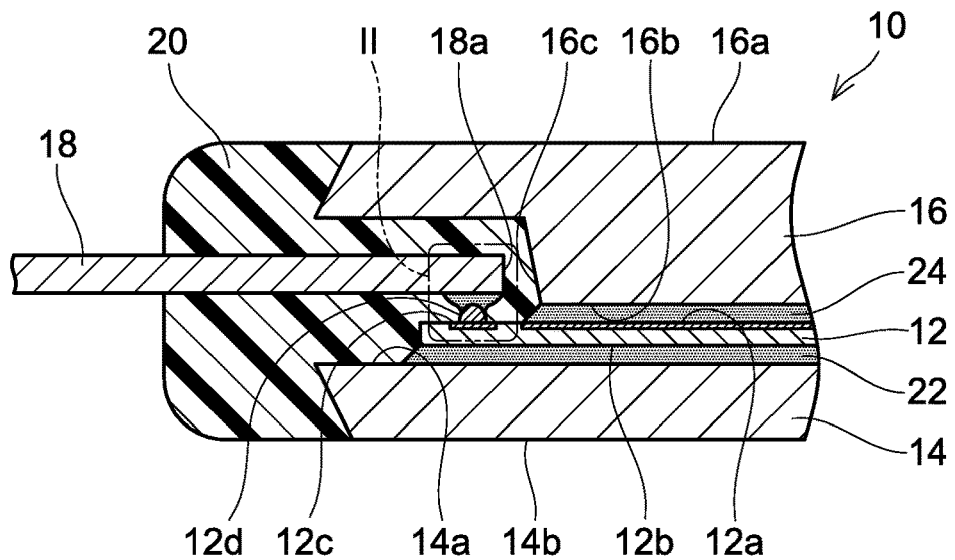
FIG. 1 is a cross-sectional view showing an internal structure of a semiconductor device 10.

In an embodiment of the present technology, a semiconductor device may comprise: a semiconductor element comprising an electrode on a surface of the semiconductor element; and a terminal bonded to the electrode via a bonding material, wherein the electrode may comprise a protrusion portion that protrudes toward the terminal and is in contact with the bonding material.

In the above-described semiconductor device, the electrode of the semiconductor element (hereinafter termed an element electrode) includes the protrusion portion that protrudes toward the terminal. Such a configuration enables the terminal and the element electrode to be bonded to each other with a certain spacing provided between the terminal and the surface of the semiconductor element. Therefore, even when the element electrode has a relatively small size, contact of the terminal and/or the bonding material with an, unintended part of the semiconductor element can be avoided.

In an embodiment of the present technology, an entirety of the protrusion portion of the element electrode may be included within a projection area on which an area of the terminal that is in contact with the bonding material is projected. Such a configuration enables the protrusion portion of the element electrode to keep opposed to the terminal even if the terminal is displaced in a direction parallel to the surface of the semiconductor element, such that the terminal and the element electrode can be bonded to each other appropriately. In other words, the displacement of the terminal relative to the semiconductor element can be tolerated to a certain degree.

In addition to or in place of the above, an entirety of the element electrode may be included within a projection area on which an area of the terminal that is in contact with the bonding material is projected. Such a configuration enables the displacement of the terminal relative to the semiconductor element to be tolerated to a greater degree.

In an embodiment of the present technology, the terminal may include a concave portion opposed to the protrusion portion of the element electrode. In this case, the bonding material may be in contact with an inner surface of the concave portion. In such a configuration, edges that define the concave portion suppress spreading of the bonding material on the terminal. This prevents an excess bonding material from making contact with an unintended part of the semiconductor element.

In place of the above, the terminal may include a convex portion opposed to the protrusion portion of the element electrode. In. this case, the bonding material may be in contact with a top surface of the convex portion. In such a configuration, edges that define the convex portion suppress spreading of the bonding material on the terminal. This prevents an excess bonding material from making contact with an unintended part of the semiconductor element.

In addition to the above, an entirety of the protrusion portion may be included within a projection area on which the top surface of the convex portion of the terminal is projected. Such a configuration enables the protrusion portion of the element electrode to keep opposed to the convex portion of the terminal even if the terminal is displaced in the direction. parallel to the surface of the semiconductor element, such that the terminal and the element electrode can be bonded to each, other appropriately. In other words, the displacement of the terminal relative to the semiconductor element can be tolerated to a certain degree. Since the bonding material (e.g., solder) that bonds the terminal and the element electrode is held therebetween, contact of the bonding material with an unintended part of the semiconductor element can be prevented.

In an embodiment of the present technology, a material constituting the protrusion portion may have a melting point higher than that of a material constituting the bonding material. Such a configuration can avoid deformation of the protrusion portion when the bonding material is melted to bond the terminal and the element electrode each other.

In addition to or in place of the above, a material constituting the protrusion portion may be different from a material constituting the element electrode. In this case, the protrusion portion may be mainly constituted of a conductor material such as a substantially ball-shaped metal. As an example, the protrusion portion may be formed by, for example, ball bonding. It should be noted that the material constituting the protrusion portion is not particularly limited, and may be the same as the material constituting the element electrode.

In addition to or in place of the above, the protrusion portion may have a porous structure. In this case, the protrusion portion may be formed by, for example, cold spraying. The protrusion portion having the porous structure allows the bonding material to penetrate into the porous structure, such that the terminal and the element electrode are bonded firmly to each other.

In an embodiment of the present technology, a height of the protrusion portion may be 100 μm or more.

In an embodiment of the present technology, the semiconductor device may further comprise an encapsulant that encapsulates the semiconductor element. In this case, the terminal may be bonded to the element electrode via the bonding material within. the encapsulant.

Representative, non-limiting examples of the present disclosure will now he described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may he utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

With reference to FIGS. 1 to 6, a semiconductor device 10 of an embodiment and a method of manufacturing the same will be described. The semiconductor device 10 is adopted in a power controller, and can configure a part of a power conversion circuit such as an inverter or a converter. The power controller herein mentioned is mounted on, for example, an electric vehicle, a hybrid vehicle, a fuel-cell vehicle, or the like.

As shown in FIG. 1, the semiconductor device 10 includes a semiconductor element 12, a signal terminal 18, and an encapsulant 20. The semiconductor element 12 is encapsulated within the encapsulant 20. The encapsulant 20 is mainly constituted of a material having insulating properties, such as an epoxy resin. The signal terminal 18 extends toward an outside to protrude from the encapsulant 20. The signal terminal 18 is electrically connected to the semiconductor element 12 within the encapsulant 20.

The semiconductor element 12 is a power semiconductor element, such as a Metal-Oxide-Semiconductor Field-Effect Transistor (MOSFET) or an Insulated Gate Bipolar Transistor (IGBT). It should be noted that the number of semiconductor elements and the type of the semiconductor element are not particularly limited. As a material constituting the semiconductor element 12, silicon (Si), silicon carbide (SiC), gallium nitride (GaN), or another type of semiconductor material can be adopted, for example.

The semiconductor element 12 includes a pair of main electrodes 12a, 12b, and a signal pad 12c connected. to the signal terminal 18. The pair of main electrodes 12a, 12b includes a first main electrode 12a and a second main electrode 12b. The first main electrode 12a and the signal pad 12c are located on one surface of the semiconductor element 12, and the second main electrode 12b is located on another surface of the semiconductor element 12. The signal pad 12c has a relatively small size compared to the first main electrode 12a. The signal pad 12c includes a protrusion portion 12d that protrudes toward the signal terminal 18. As an example, the protrusion portion 12d has a substantially dome shape. A cross-sectional area of this shape of the protrusion portion 12d decreases toward the signal terminal 18.

The pair of main electrodes 12a, 12b, the signal pad 12c, and the protrusion portion 12d each is mainly constituted of a conductor material, such as a nickel-based metal or another metal. The nickel-based metal herein mentioned indicates pure nickel or an alloy mainly constituted of nickel. It should be noted that the :material constituting the protrusion portion 12d is not limited thereto. The material constituting the protrusion portion 12d, in particular, has a melting point higher than that of a material constituting a bonding material (which is solder, in the present embodiment). The protrusion portion 12d may be constituted of the same material as the material of the signal pad 12c, or may be. constituted of a material different therefrom. The signal pad 12c is an example of electrode (element electrode) in the technology disclosed herein, and the signal terminal 18 is an example of terminal in the technology disclosed herein.

The semiconductor device 10 includes a lower heat-dissipating plate 14 and an upper heat-dissipating plate 16. Each of the heat-dissipating plates 14, 16 is a member having a substantially rectangular parallelepiped shape, and is mainly constituted of a conductor material such as copper or another metal. The lower heat-dissipating plate 14 includes a first main surface 14a and a second main surface 14b located opposite to the first main surface 14a. The first main surface 14a of the lower heat-dissipating plate 14 is bonded to the second main electrode 12b of the semiconductor element 12 via a solder layer 22. The lower heat-dissipating plate 14 is thus electrically connected to the semiconductor element 12. The second main surface 14b of the lower heat-dissipating plate 14 is exposed at one surface of the encapsulant 20.

Similar to the lower heat-dissipating plate 14, the upper heat-dissipating plate 16 includes a first main surface 16a and a second main surface 16b located opposite to the first main surface 16a. The upper heat-dissipating plate 16 includes a spacer portion 16c that protrudes on the second main surface 16b. In this regard, the upper heat-dissipating plate 16 differs from the lower heat-dissipating plate 14. The second main surface 16b of the upper heat-dissipating plate 16 is bonded to the first main electrode 12a of the semiconductor element 12 via a solder layer 24. The upper heat-dissipating plate 16 is thus electrically connected to the semiconductor element 12. The first main surface 16a of the upper heat-dissipating plate 16 is exposed at another surface of the encapsulant 20. As is described above, the lower heat-dissipating plate 14 and the upper heat-dissipating plate 16 function as heat-dissipating plates that dissipate heat generated in the semiconductor element 12.

The upper heat-dissipating plate 16 is not limited to the above-described one. For example, the upper heat-dissipating plate 16 does not necessarily include the spacer portion 16c. In this case, the semiconductor device 10 may include a separate conductor spacer between the upper heat-dissipating plate 16 and the semiconductor element 12, in place of the spacer portion 16c of the upper heat-dissipating plate 16. The spacer portion 16c of the upper heat-dissipating plate 16 or the conductor spacer can provide, as needed, a space for bonding the signal terminal 18 to the signal pad 12c between the upper heat-dissipating plate 16 and the semiconductor element 12.

Moreover, as described above, the bonding material having electrical conductivity, such as solder, is used to bond the upper heat-dissipating plate 16 and the semiconductor element 12 and to bond the semiconductor element 12 and the lower heat-dissipating plate 14. It should be noted that these bonding are not limited to bonding using the bonding material, and may be bonding by other aspects.

The signal terminal 18 is a member having a substantially elongated plate shape. The signal terminal 18 includes one end 18a and the other end (not shown) located opposite to the one end 18a in a longitudinal direction of the signal terminal 18. The signal terminal 18 is partially opposed to the signal pad 12c. The signal terminal 18 is mainly constituted of a conductor material such as copper or another metal, and is electrically connected to the semiconductor element 12 within the encapsulant 20, as described. Specifically, the one end 18a of the signal terminal 18 is bonded to the signal pad 12c of the semiconductor element 12 via solder. Here, the solder is an example of bonding material in the technology disclosed herein. The bonding material is not limited to solder, and may be another bonding material having electrical conductivity.

As described above, the signal pad 12c of the semiconductor element 12 has a relatively small size. Therefore, unintentional displacement of the signal terminal 18 during the bonding of the one end 18a of the signal terminal 18 to the signal pad 12c of the semiconductor element 12 would lead to contact of the signal terminal 18 and/or the solder with an unintended part of the semiconductor element 12, for example.

Regarding this problem, in the semiconductor device 10 of the present embodiment, the signal pad 12c of the semiconductor element 12 includes the protrusion portion 12d that protrudes toward the signal terminal 18. Such a configuration enables the signal terminal 18 and the signal pad 12c to be bonded to each other with a certain spacing provided between the signal terminal 18 and the surface of the semiconductor element 12. Therefore, even when the signal pad 12c has a relatively small electrode size, contact of the signal terminal 18 and/or the solder with an unintended part of the semiconductor element 12 can be avoided. This improves manufacturing quality of the semiconductor device 10. As an example, the height of the protrusion portion 12d may be approximately 100 μm or more. This ensures sufficient insulation between the signal terminal 18 and an unintended part of the semiconductor element 12, other than the signal pad 12c.

Figure 2:
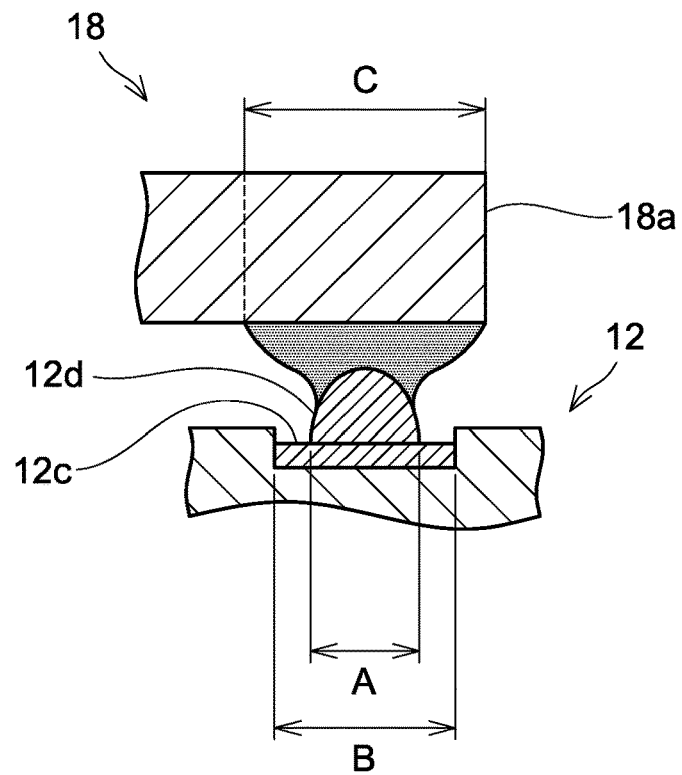
FIG. 2 is an enlarged view of a part II in FIG. 1. To clearly show configurations of a signal terminal 18, a signal pad 12c, and a protrusion portion 12d, illustration of an encapsulant 20 is omitted. The illustration of the encapsulant 20 is omitted also in FIGS. 7, 8, 9, and 10, as well.

Moreover, as shown in FIG. 2, in the semiconductor device 10 of the present embodiment, an entirety of the protrusion portion 12d (a region A) of the signal pad 12c is included within a projection area on which an area of the signal terminal 18 that is in contact with the solder (a region C) is projected. Such a configuration enables the protrusion portion 12d of the signal pad 12c to keep opposed to the signal terminal 18, even if the signal terminal 18 is displaced in a direction parallel to the surface of the semiconductor element 12. Therefore, the signal terminal 18 and the signal pad 12c can be bonded appropriately. In other words, the displacement of the signal terminal 18 relative to the semiconductor element 12 can be tolerated to a certain degree.

Furthermore, in the semiconductor device 10 of the present embodiment, an entirety of the signal pad 12c (a region B) is included within the projection area on which the area of the signal terminal 18 that is in contact with the solder (the region C) is projected. Such a configuration can tolerate the displacement of the signal terminal 18 relative to the semiconductor element 12 to a greater degree. In this case, for example, the entirety of the protrusion portion 12d may be located within the solder.

Figure 3:
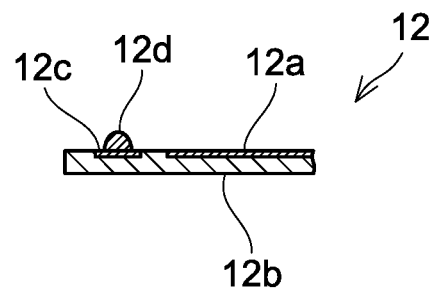
FIG. 3 is a diagram showing a process of preparing a semiconductor element 12 in which the signal pad 12c includes the protrusion portion 12d.

With reference to FIGS. 3 to 6, a method of manufacturing the semiconductor device 10 will be described. Firstly, as shown in FIG. 3, the semiconductor element 12 that includes the signal pad 12c including the protrusion portion 12d is prepared. As an example, the protrusion portion 12d of the semiconductor element 12 has a porous structure and is formed by, for example, cold spraying. Specifically, the protrusion portion 12d is formed by spraying metal powder that is to constitute the protrusion portion 12d onto a surface of the signal pad 12c. In this case, the material constituting the protrusion portion 12d may be the same as the material constituting the signal pad 12c. Such a configuration allows the metal powder that is to constitute the protrusion portion 12d to easily adhere to the signal pad 12c when the protrusion portion 12d is formed on the signal pad 12c. The cold spraying enables spraying of metal powder at its melting point or lower, and hence is advantageous in that the metal powder can be sprayed onto a substrate without being thermally altered. Moreover, the protrusion portion 12d having the porous structure, as in the semiconductor device 10 of the present embodiment, allows solder to penetrate into the porous structure during soldering (to be described later), such that the signal terminal 18 and the signal pad 12c are firmly bonded.

Figure 4:
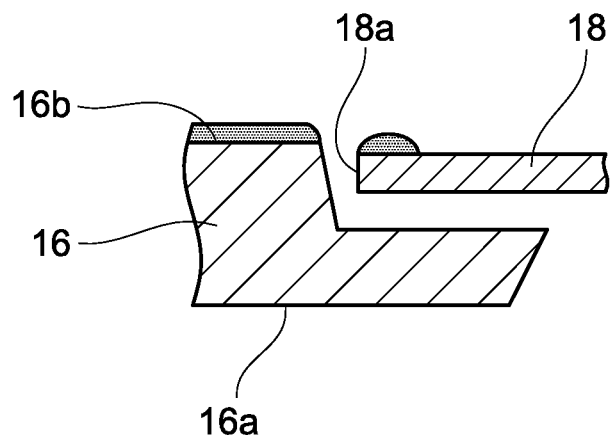
FIG. 4 is a diagram showing a process of preparing an upper heat-dissipating plate 16 and the signal terminal 18 and applying pre-solder onto each of them.

Next, as shown in FIG. 4, the upper heat-dissipating plate 16 and the signal terminal 18 are prepared, and pre-solder is applied on each of them. As an example, sheet-shaped solder is applied on each of a part of the second main surface 16b of the upper heat-dissipating plate 16 to be bonded and a part of the signal terminal 18 to be bonded, and is heated and melted in a reflow furnace or the like. By applying the pre-solder in advance on the parts to be bonded, soldering (to be described later) can be performed efficiently. Here, the upper heat-dissipating plate 16 and the signal terminal 18 may be prepared as an integrally-formed single part (a lead frame).

Figure 5:
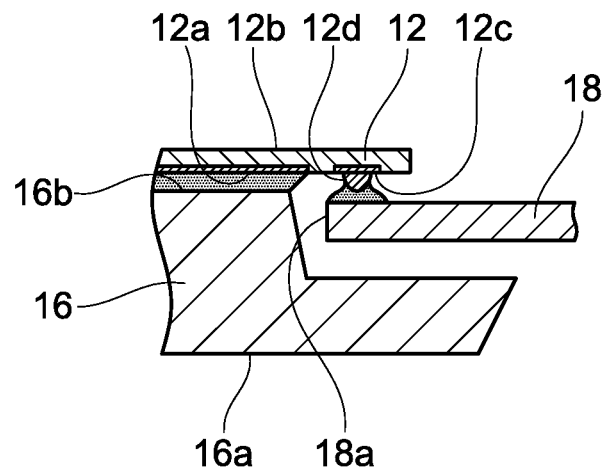
FIG. 5 is a diagram showing a process of soldering the semiconductor element 12 to the upper heat-dissipating plate 16 and the signal terminal 18.

After the application of the pre-solder, the semiconductor element 12 is soldered to the upper heat-dissipating plate 16 and the signal terminal 18 as shown in FIG. 5. Specifically, the semiconductor element 12 is firstly stacked on the upper heat-dissipating plate 16 and the signal terminal 18. The sheet-shaped solder is disposed between the upper heat-dissipating plate 16 and the first main electrode 12a of the semiconductor element 12, and between the signal terminal 18 and the signal pad 12c. Next, the solder is heated and melted in a reflow furnace or the like. Thereby, the upper heat-dissipating plate 16 and the first main electrode 12a are soldered, and the signal terminal 18 and the protrusion portion 12d of the signal pad 12c are soldered. Here, the melting point of the material constituting the protrusion portion 12d is higher than that of the material constituting the solder. Therefore, when the solder is melted to bond the signal terminal 18 and the signal pad 12c, deformation of the protrusion portion 12d can be avoided.

Figure 6:
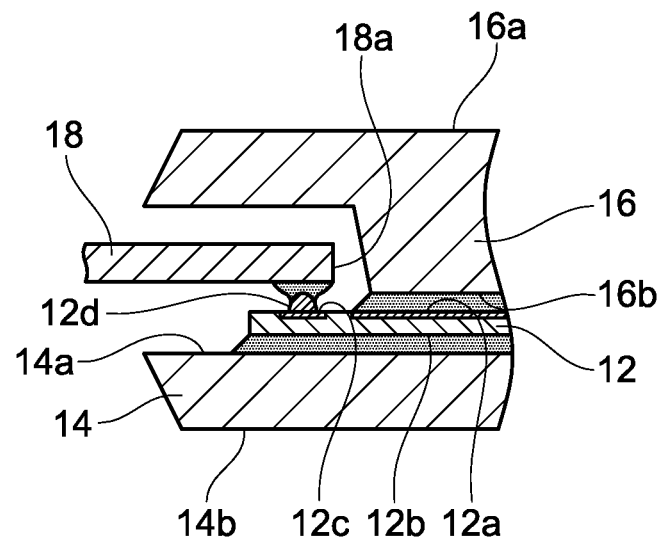
FIG. 6 is a diagram showing a process of soldering the semiconductor element 12 to a lower heat-dissipating plate 14.

After the soldering of first main electrode 12a side of the semiconductor element 12, the second main electrode 12b side of the semiconductor element 12 is soldered to the lower heat-dissipating plate 14 as shown in FIG. 6. Sheet-shaped solder is disposed between the second main electrode 12b of the semiconductor element 12 and the lower heat-dissipating plate 14. This solder is heated and melted, such that the lower heat-dissipating plate 14 and the semiconductor element 12 are soldered.

The semiconductor device 10 is assembled through the above-described steps. The above-described manufacturing method can avoid contact of the signal terminal 18 and/or the solder with an unintended part of the semiconductor element 12 even when the signal pad 12c has a relatively small electrode size. It should be noted that this manufacturing method is merely an example, and is not particularly limited. For other manufacturing steps, conventional technologies can be used for manufacturing.

The shapes of the signal terminal 18 and the protrusion portion 12d in the present technology are not limited to the above-described ones, and can be modified variously. With reference to FIGS. 7 to 10, some of the variants will be described.

Figure 7:
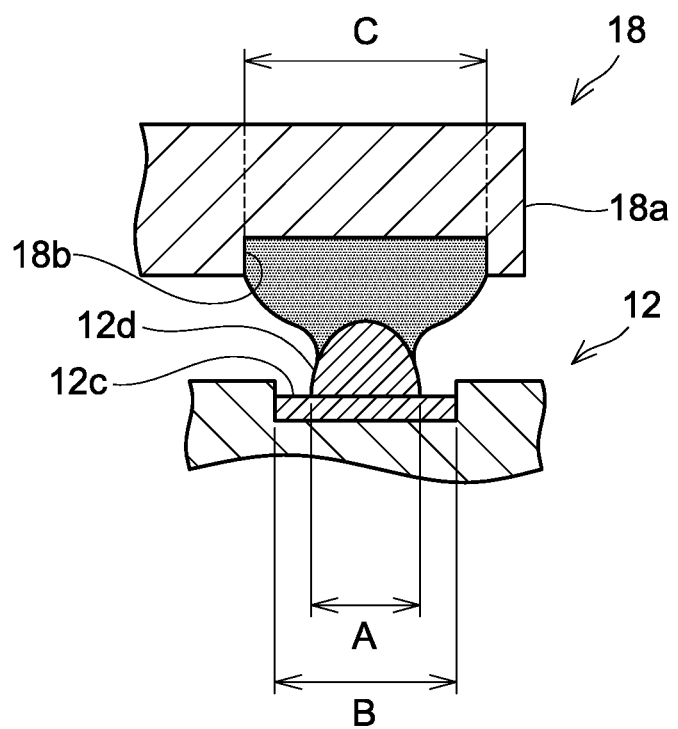
FIG. 7 is a cross-sectional view showing a variant of the signal terminal 18.

As shown in FIG. 7, the signal terminal 18 may include a concave portion 18b that is opposed to the protrusion portion 12d of the signal pad 12c. In this case, the solder may be in contact with an inner surface of the concave portion 18b. Thus, the inner surface of the concave portion 18b corresponds to the area of the signal terminal 18 that is in contact with the solder (the region C). In such a configuration edges that define the concave portion 18b suppress spreading of the solder on the signal terminal 18. This prevents excess solder from making contact with an unintended part of the semiconductor element 12.

Figure 8:
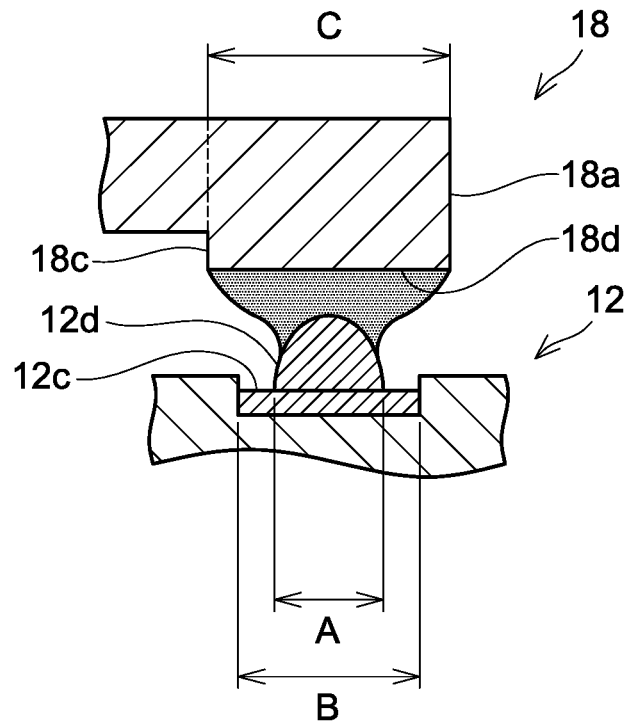
FIG. 8 is a cross-sectional view showing another variant of the signal terminal 18.

Alternatively, as shown in FIG. 8, the signal terminal 18 may include a convex portion 18c that is opposed to the protrusion portion 12d of the signal pad 12c. In this case, the solder may be in contact with a top surface 18d of the convex portion 18c. Thus, the top surface 18d of the convex portion 18c corresponds to the area of the signal terminal 18 that is in contact with the solder (the region C). In such a configuration, edges that define the convex portion 18c suppress spreading of the solder on the signal terminal 18. This prevents excess solder from making contact with an unintended part of the semiconductor element 12.

In the configuration shown in FIG. 8, the convex portion 18c of the signal terminal 18 may be sufficiently larger than the protrusion portion 12d of the signal pad 12c. Specifically, the entirety of the protrusion portion 12d may be included within a projection area on which the top surface 18d of the convex portion 18c of the signal terminal 18 is projected. Such a configuration enables the protrusion portion 12d of the signal pad 12c to keep opposed to the convex portion 18c of the signal terminal 18, even if the signal terminal 18 is displaced in the direction parallel to the surface of the semiconductor element 12. Therefore, the signal terminal 18 and the signal pad 12c can be bonded appropriately. In other words, the displacement of the signal terminal 18 relative to the semiconductor element 12 can be tolerated to a certain degree. Since the solder that bonds the signal terminal 18 and the signal pad 12c is held therebetween, contact of the solder with an unintended part of the semiconductor element 12 can be prevented.

Figure 9:
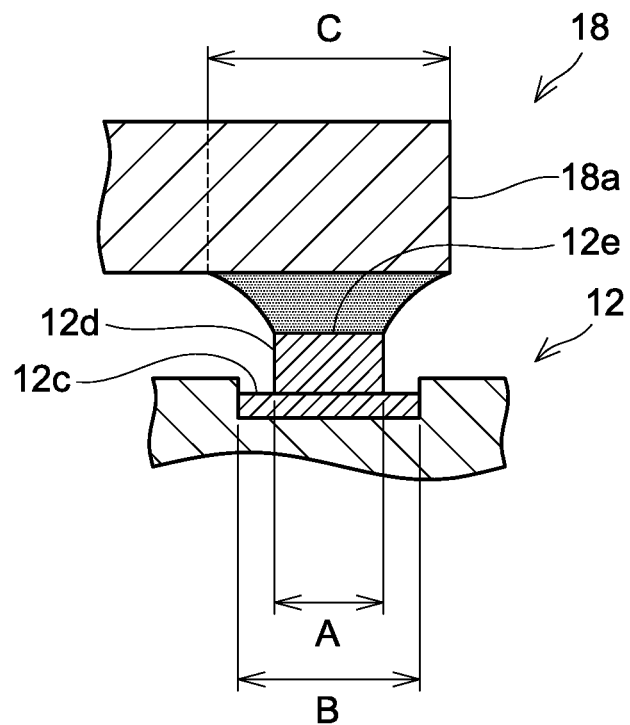
FIG. 9 is a cross-sectional view showing a variant of the protrusion portion 12d.

In the semiconductor device 10 of the present embodiment, the protrusion portion 12d of the signal pad 12c has a substantially dome shape, however, the shape of the protrusion portion 12d is not limited thereto. As shown in FIG. 9, the protrusion portion 12d may have, for example, a columnar shape that includes a top surface 12e opposed to the signal terminal 18. Such a configuration enables the soldering between the protrusion portion 12d and the signal terminal 18 with stable posture of the signal terminal 18 relative to the protrusion portion 12d.

Figure 10:
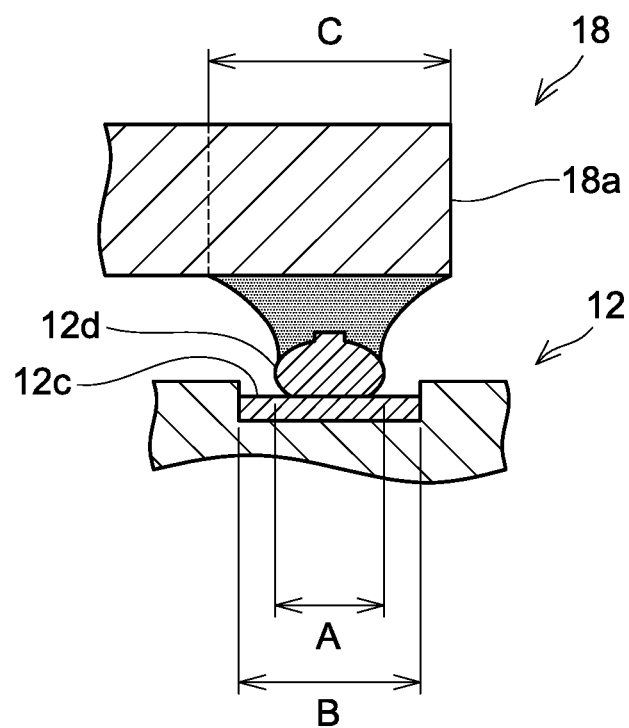
FIG. 10 is a cross-sectional view showing another variant of the protrusion portion 12d.

Alternatively, as shown in FIG. 10, the protrusion portion 12d may have a substantially spherical shape (including a prolate-spheroid shape or oblate-spheroid shape). As an example, the protrusion portion 12d may be formed by, for example, ball bonding, In other words, a tip of a wire is melted to have a spherical shape, and the spherical-shaped tip is bonded to the signal pad 12c. Subsequently, the spherical-shaped tip is cut from the wire, by which the protrusion portion 12d configured of the spherical-shaped. tip can be provided on the signal pad 12c. In this case, the material constituting the protrusion portion 12d may be different from the material constituting the signal pad 12c.

What is claimed is:
1. A semiconductor device comprising:
a semiconductor element comprising a first main surface, a first electrode on the first main surface, and a second electrode on the first main surface, a surface of the second electrode being smaller than a surface of the first electrode;
a first conductor plate bonded to the surface of the first electrode via a first bonding material; and
a terminal bonded to the surface of the second electrode via a second bonding material,
wherein the second electrode comprises a protrusion portion on the surface of the second electrode that protrudes toward the terminal and is in contact with the second bonding material, and a distance between the protrusion portion and the terminal is smaller than a distance between the first electrode and the first conductor plate.

2. The semiconductor device according to claim 1, wherein an entirety of the protrusion portion is included within a projection area on which an area of the terminal that is in contact with the second bonding material is projected.

3. The semiconductor device according to claim 1, wherein an entirety of the electrode is included within a projection area on which an area of the terminal that is in contact with the second bonding material is projected.

4. The semiconductor device according to claim 1, wherein
the terminal comprises a concave portion opposed to the protrusion portion of the electrode, and
the second bonding material is in contact with an inner surface of the concave portion.

5. The semiconductor device according to claim 1, wherein
the terminal comprises a convex portion opposed to the protrusion portion of the second electrode, and
the second bonding material is in contact with a top surface of the convex portion.

6. The semiconductor device according to claim 5, wherein an entirety of the protrusion portion is included within a projection area on which the top surface of the convex portion is projected.

7. The semiconductor device according to claim 1, wherein a material constituting the protrusion portion has a melting point higher than that of a material constituting the second bonding material.

8. The semiconductor device according to claim 1, wherein a material constituting the protrusion portion is different from a material constituting the second electrode.

9. The semiconductor device according to claim 1, wherein the protrusion portion has a porous structure.

10. The semiconductor device according to claim 1, wherein a height of the protrusion portion is 100 µm or more.

11. The semiconductor device according to claim 1, further comprising an encapsulant that encapsulates the semiconductor element,
wherein the terminal is bonded to the second electrode via the second bonding material within the encapsulant.

12. The semiconductor device according to claim 1, wherein
the terminal comprises a surface opposed to the first main surface of the semiconductor element, the surface of the terminal comprising a flat surface and a concave portion depressed with respect to the flat surface, and
the second bonding material is in contact with an inner surface of the concave portion and is not in contact with the flat surface.

13. The semiconductor device according to claim 1, wherein
the terminal comprises a surface opposed to the first main surface of the semiconductor element, the surface comprising a flat surface and a convex portion protruding with respect to the flat surface,
the convex portion comprises a top surface and a side surface extending from the top surface to the flat surface, and
the second bonding material is in contact with the top surface of the convex portion and is not in contact with the side surface.

14. The semiconductor device according to claim 13, wherein an entirety of the protrusion portion is included within a projection area on which the top surface of the convex portion is projected.

15. The semiconductor device according to claim 1, further comprising:
an encapsulant encapsulating the semiconductor element; and
a second conductor plate located to face the first conductor plate across the semiconductor element,
wherein
the semiconductor element further comprises a second main surface opposite to the first main surface and a third electrode located on the second main surface, the third electrode being bonded to the second conductor plate,
the first conductor plate comprises a first inner surface bonded to the first electrode via the first bonding material within the encapsulant, and a first outer surface opposite to the inner surface and exposed to outside of the encapsulant, and
the second conductor plate comprises a second inner surface bonded to the third electrode via a third bonding material within the encapsulant, and a second outer surface opposite to the second inner surface and exposed to the outside of the encapsulant.

* * * * *